United States Patent [19]

Chappelow et al.

[11] Patent Number: 5,325,180
[45] Date of Patent: Jun. 28, 1994

[54] APPARATUS FOR IDENTIFYING AND DISTINGUISHING TEMPERATURE AND SYSTEM INDUCED MEASURING ERRORS

[75] Inventors: Ronald E. Chappelow; Edward W. Conrad, both of Jeffersonville, Vt.

[73] Assignee: International Business Machines Corporation, Armonk, N.Y.

[21] Appl. No.: 999,020

[22] Filed: Dec. 31, 1992

[51] Int. Cl.$^5$ .............................................. G01B 11/00
[52] U.S. Cl. .................... 356/401; 250/443.1; 250/491.1
[58] Field of Search ....................... 356/399, 400, 401; 250/548, 442.11, 443.1, 491.1

[56] References Cited

U.S. PATENT DOCUMENTS 5,031,331 7/1991 Herzog et al. .

OTHER PUBLICATIONS

Patent Abstracts of Japan, Abstract Group No. E151, vol. 7, No. 4, Publication date Jan. 8, 1983, Abstract of 57-162431.

Primary Examiner—F. L. Evans
Attorney, Agent, or Firm—Calfee, Halter & Griswold

[57] ABSTRACT

The present invention provides a device which can identify and measure both thermally induced errors and system induced errors in a measuring system, especially a photolithographic system for processing semiconductor wafers. The system includes a stage having associated therewith a first material having a known, relatively high, coefficient of thermal expansion (CTE) and a second material having a significantly lower (preferably zero) CTE in the temperature range in which the system is to be used. The system has a "home" position or location. At least one first indicia mark or set of marks is placed on the first material at a given known (calibrated) distance(s) (at a given known temperature) from the "home" position, and at least one second indicia mark or set of marks is placed on the second material at a given known (calibrated) distance(s) from the home position. The system is configured to periodically measure (even during wafer processing) the distances between each of the indicia marks and the "home" position. By periodically measuring these distances and checking them against their calibrated values, the system can determine, measure and distinguish both system induced errors and temperature induced errors.

10 Claims, 1 Drawing Sheet

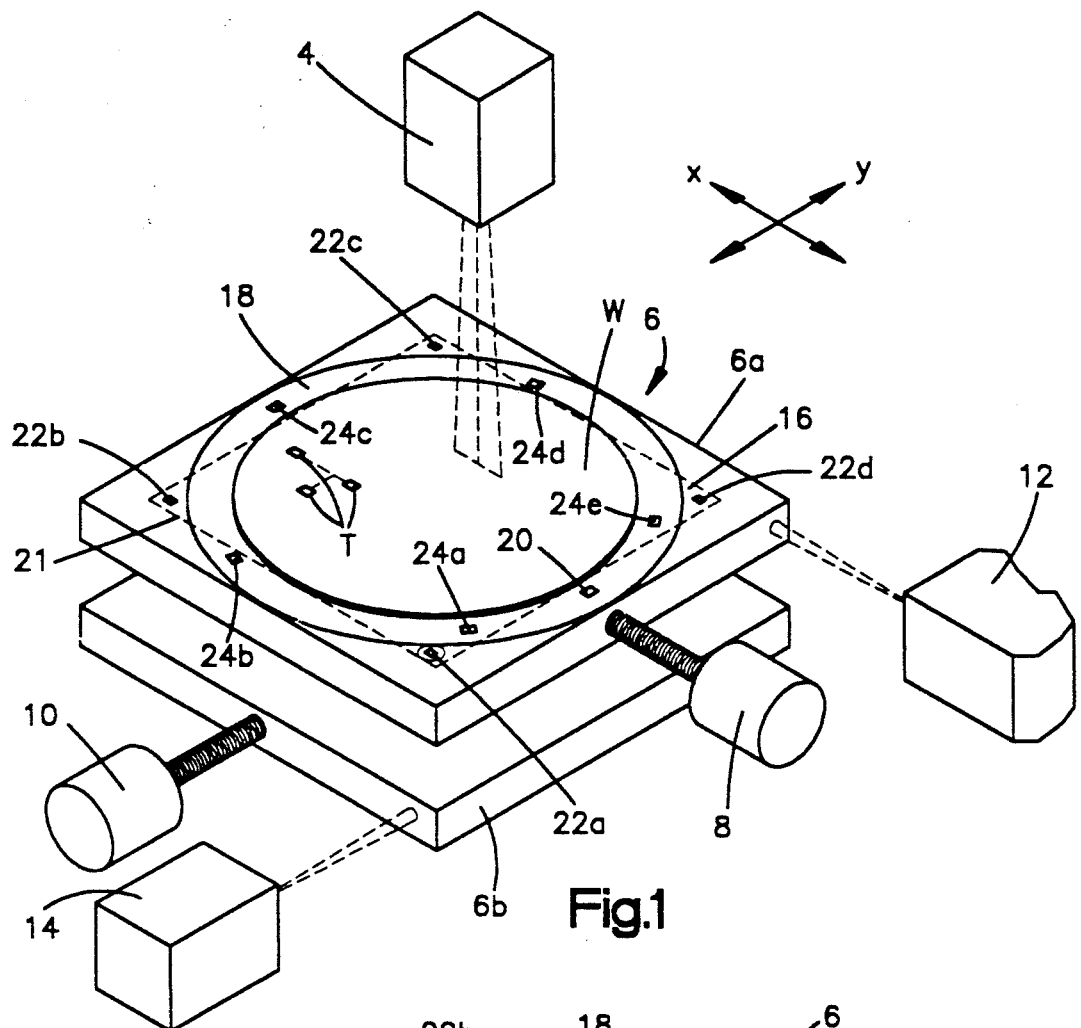
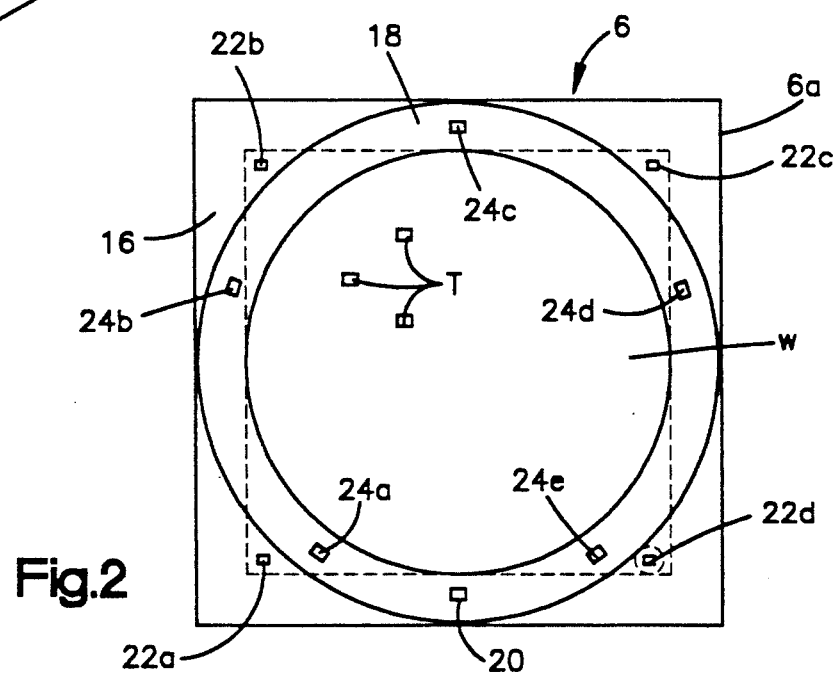

APPARATUS FOR IDENTIFYING AND DISTINGUISHING TEMPERATURE AND SYSTEM INDUCED MEASURING ERRORS

FIELD OF THE INVENTION

This invention relates generally to measuring systems, and more particularly to systems for identifying and distinguishing between temperature induced measurement variations and system induced variations of measurements. In even more particular aspects, this invention relates to devices for determining and distinguishing between temperature and system induced measurement variations on tools such as those used for photolithography on semi-conductor wafers which wafers are mounted on a stage for movement or positioning on an x-y axis.

BACKGROUND ART

In practicing photolithography to pattern semi-conductor wafers, a common technique is to use a photolithographic tool which has a stage mounted for movement in the x-y plane. A "home" position is established for the tool from which measurements are made to the various target locations on the wafer where exposure is to take place. Typically the target locations will have the targets marked on the wafer designating the desired exposure locations. The stage moves the wafer to bring the target into registration with the exposure tool. After the target is acquired in the exposure field of the tool, normally by means of a laser scanner/detector, final precise alignment of the wafer is accomplished to give exact desired alignment of the exposure field of the tool with the target. The exact location of the photoimage is then recorded by the system based on the measurements made from the "home" position to the final measured position of the target to thereby definitively record and preserve the location of the target. Thus, when any future operations are performed with respect to or otherwise involving the location of the target on the wafer, the actual location of the target will be known.

As the photoimage ground rules, or dimensional tolerances, become tighter and tighter, even small errors in measurements of the locations of the targets can cause significant problems in defining the exact location of the actual exposure. With looser ground rules these would be tolerable, but under the tighter ground rules these errors are becoming unacceptable. One technique for identifying and determining such errors is described in IBM Technical Disclosure Bulletin Vol. 35, No. 3, August 1992, p. 234. This article describes a technique as follows:

Systematic drift of measurement tool repeatability as a function of time is an example of 0th-order drift that is often compensated by a simple offset adjustment. Such techniques based only on periodic re-measurement of known targets have proved inadequate for present technologies. First-order compensation adds curve fitting of measurement system parameters as a function of time to periodic site remeasurement in order to correct measured data. The concept is extendable to higher order error compensation.

The proposed first-order compensation techniques includes the following procedures.

1. Periodically measure a number of sites. The theoretical minimum number is required is three, but five sites are used in practice.
2. First-order compensation cannot be performed in real time, but can only be performed subsequent to collecting all data.
3. Perform compensation on six system parameters.
4. Perform analysis to identify the correct functional form for the six compensation functions.

The set of all five-point drift compensation data is analyzed according to chosen basis functions such as polynomials in x and y. Each set of five data points yields a corresponding set of values for the six first-order parameters. The new set of values are curve fitted according to chosen orthogonal basis functions. The resulting six curves identify the form of the drift as a function of measurement number, or, equivalently, as a function of measurement time.

At each measurement point, the six drift parameters are used to correct the measured data. For example, the x-scale parameter (called Mx) is subtracted from its average value throughout the measurement run, yielding an Mx correction factor. The correction factor is multiplied by the x-location value currently in effect to produce a correction value (in nm) for Mx drift. The remaining parameters are treated similarly. All six correction values are subtracted from the measurement data at that measurement point to obtain compensation for drift in all six first-order parameters. These operations are repeated to compensate for drift in all first-order parameters at all measurement points. The technique described can be extended to include higher order effects if and when such extension is warranted.

This technique while valuable, has certain inherent limitations. The known sites or measuring points referred to in the article are printed or otherwise inscribed on the stage. Thus, when the periodic measurements are made, the measurement to each site will include both system induced errors, and temperature induced errors. These cannot be separately identified or distinguished by this technique. Under tighter ground rules, it becomes necessary to separate these two types of errors since temperature induced errors result in actual movement of the target locations while system or measuring errors given an erroneous reading of where the target is actually located.

For example, temperature variations as little as 0.1 degree C. can result in errors of as much as 50 nm on 200 mm silicon wafers at locations remote from each other; and errors of this magnitude can result in significant misidentification of the location of the exposed areas of the wafer. The so-called system errors are due to conditions changing either within the measuring system or that affect the measuring system. One potential source of such errors may be in the laser interferometer which is typically used for measurements. While this instrument is generally very accurate, it is sensitive to certain environmental changes such as changes in the humidity, etc, causing measurement errors. Other types of measuring errors, the source of which is often unknown, also may occur. These errors are of a different type from those caused by temperature variations. With errors caused by temperature variations, the wafer physically moves due to thermal expansion thus physically moving the target locations. However, with system induced errors, the physical position of the target doesn't move, but rather the measurement of the location by the system changes thus causing a wrong reading of the actual location. In other words, the system may indicate that the target has moved when in fact it has not, or may indicate more or less movement than what has actually occurred. Thus, it becomes desirable to identify, and measure both types of errors so that proper corrections can be made in recording the precise position of the exposure of the wafer.

SUMMARY OF THE INVENTION

According to the present invention a device is provided which can separately indicate both thermally induced errors and system induced errors in a measuring system, especially a photolithographic system or tool for processing semiconductor wafers. The system includes a stage having associated therewith a first material having a known relatively high coefficient of thermal expansion (CTE) and a second material having a different (preferably zero) CTE in the temperature range in which the system is to be used. The system has a "home" position or location. A first indicia mark or set of marks is placed on the first material at a given known (calibrated) distance(s) (at a calibration temperature) from the "home" position, and a second indicia mark or set of marks is placed on the second material at a given known (calibrated) distance(s) from the home position, preferably at the same calibration temperature. The system is configured to periodically measure (even during wafer processing) the distances between each of the indicia marks and the "home" position. By periodically measuring these distances and checking them against their known values the invention facilitates the identification, measurement, and distinguishing between system induced measurement errors and temperature induced errors, to thereby allow correction of the measurements with respect to each of these types of errors.

DESCRIPTION OF THE DRAWINGS

FIG. 1 is a perspective view, somewhat diagrammatic of a photolithographic system incorporating the present invention; and FIG. 2 is a plan view of the stage of the system of FIG. 1 showing the construction thereof and the indicia marks thereon.

DESCRIPTION OF THE PREFERRED EMBODIMENT

Referring now to the drawings, and for the present to FIG. 1, a diagrammatic representation of portions of a photolithographic tool or system are shown in a very schematic form. The specific type of photolithographic tool is immaterial provided it works by movement of a stage with respect to the exposure portion of the tool in the x-y plane. For example, the Nikon XY21 tool as well as the Leica LMS2000 tool can be used effectively as the structural basis for practicing this invention. The tool includes a laser scanner and detector shown generally at 4 which is used to acquire specific targets T on wafer W which is to be lithographically processed. The wafer W is mounted on a stage designated generally as 6. The stage has an upper member 6a and a lower member 6b, each of which is mounted in a conventional way on gibs or the like (not shown) for sliding movement. The stage members 6a and 6b are driven respectively by drive motors and worm gears 8 and 10 to move the stage in the x-y plane in a well known manner.

A pair of laser interferometers 12, 14 are provided to measure the movement of the stage members 6a and 6b respectively so that any specific target T on the wafer W can be aligned roughly with the laser scanner and detector 4. Once the target is acquired, the tool provides precise alignment on the target. To the extent described so far, such a construction of a photolithographic tool is well known in the art and is employed by tools such as those noted above.

According to this invention, the stage member 6a incorporates in its construction two different materials having significantly different coefficients of thermal expansion (CTE). The main body 16 of the of the stage member 6a is formed, for example, of aluminum which has a relative high CTE, e.g., about 40 parts per million (ppm) per degree C. and the center portion 18 of the stage member 6a is formed of a ring of material having a very low, i.e. essentially zero, CTE, such as for example, a ceramic material of the type sold by Schott Glaswerke under the name Zerodur. The ring 18 is somewhat larger than the wafer W which is supported thereon for lithographic processing by the system. For measurement purposes the system has a "home" position or location with respect to the relative position of the stage and the laser scanner and detector 4 which "home" position is designated on the stage member 6a by the reference character 20. All measurements are made from this "home" position 20 in a well known manner. (As used herein, the term "home" position is a concept which is used to designate any known position from which measurements can be made. The depiction of the home position at location 20 is to aid in visualizing the operation of the tool but this location does not need to be at any particular location. Hence, the term "home" position or location as used herein means any known position of the stage with respect to the scanner and detector from which measurements can be made.) The dotted lines 21 indicate the limit of travel of the stage 6.

The main body 16 of the stage member 6a has four indicia marks 22a, 22b, 22c, and 22d formed thereon which are recognizable by the laser scanner and detector 4. These marks can be etched, or printed on, or may be formed in any manner that can be recognize by the scanner and detector 4. These indicia marks are each located at a precisely known calibrated distance from the home position 20 (at a given preselected temperature, e.g. 25° C.). Additionally, the center or ring portion 18 of the stage member 6a has five indicia marks 24a, 24b, 24c, 24d and 24e. These are also located at precisely known calibrated distances from the "home" position 20 of the system. (It is to be understood that more or less indicia marks could be provided; however, for measurements in an x-y plane in photolithography at least three marks would generally be required). As indicated above, for "acquiring" a target, the stage is moved, in a well known manner under control of a program, the indicated distance and direction from the home position 20 to where the required target T nominally is indicated to reside according to the program. This will put the wafer in the general area of the desired target T on the wafer W. However, the positioning may not be exact for reasons of possible induced error in measuring or temperature related errors as indicated above. Nevertheless, the laser scanner and detector 4 will acquire the target T on the wafer W and then move the stage to exactly position the target for exposure in a well known manner, and as is done by the above noted tools. It is this final position that will be recorded (in a recorder not shown) as the position of the lithographic image on the wafer. However, since this position may have the induced errors indicated above this invention will check for, measure, and distinguish these errors if they are present.

To make these measurements, the system will periodically measure the distance from the home position 20 to the indicia marks 22a, 22b, 22c and 22d on the main body 16. As indicated above, these indicia marks are originally calibrated at a given known temperature, e.g. 25 degrees C. to each be a given known distance from the home position 20; hence any difference in the measured distance from the calibrated distance represents an error. In the case of the marks 22a, 22b, 22c, and 22d on the main body 18, this error could have both a thermal error component and a system measuring error component. The system measurement error component can be measured by measuring the distance from the home position to the indicia marks 24a, 24b, 24c, 24d and 24e. Since these marks are on the ring that is essentially unaffected by temperature changes, any measured difference from the calibrated distance of these indicia marks 24a, 24b, 24c, and 24d is due to system measuring error. From these two readings of measured distances both thermal errors and system errors can be identified. With the thermally induced errors separately identified, relative displacements of a set of target positions on a wafer can be more accurately determined by simply factoring the CTE of the main body of the wafer holder to the CTE of the wafer itself. Moreover, the invention results in improving the correction of system induced errors. Because the invention more clearly indicates raw data resulting from system errors, the correction of such errors (such as by use of the methods described in the above-cited IBM Technical Disclosure Bulletin article) becomes more accurate, because the data that is inputted to the correction calculation more accurately reflects errors due solely to the measurement system. It is not necessary to know exactly what caused the system measuring errors to correct them, all that needs to be done is to identify them as such.

As described herein, the ring 18 is formed of a material which has essentially a zero CTE. However, it is not essential that this CTE be zero. It is sufficient that the two sections 16 and 18 be formed of material having significantly different CTE's and this difference should be as great as possible, since generally speaking, the greater this difference, the more precise will be the determination of the different error components. The use of the material having a zero CTE for the ring 18 is preferred because it does afford this large difference, and also simplifies calculation of the system induced error component.

Moreover, while the invention has been described as part of the photolithographic tool itself, it can also be used in conjunction with a measurement tool that verifies that the images have been printed in accordance with their requisite positions along the wafer. In either case, while the invention has been described with reference to a table movable in the x-y plane, the invention could be applied to a table movable with any number of degrees of freedom.

Although several embodiments of this invention have been shown and described, various adaptations and modifications can be made without departing from the scope of the invention as defined in the appended claims.

What is claimed is:

1. A device for separately indicating both system induced error and thermally induced errors in a measuring system wherein the measurements are made from a given home location to preselected positions on a workpiece and wherein at least one linear distance is measured from said home location comprising;
   a workpiece support member having associated therewith:
      a first material having a predetermined known first coefficient of thermal expansion, and
      a second material having a second predetermined known coefficient of thermal expansion which is different from that of the first material;
      said first material having at least one first indicia mark formed thereon at a first given distance from the home location at a predetermined temperature; and,
      said second material having at least one second indicia mark formed thereon at a second given distance from the home location.

2. The invention as defined in claim 1 wherein there are a plurality of each of said first and second indicia marks on each of said first and second materials.

3. The invention as defined in claim 2 wherein said workpiece support member is movable in the x-y plane.

4. The invention as defined in claim 3 wherein said workpiece support member is a portion of a photolithographic device.

5. The invention as defined in claim 3 wherein said workpiece support member is constructed at least in part of said first or second materials.

6. The invention as defined in claim 1 wherein said second material has essentially a zero coefficient of thermal expansion.

7. In a tool having a scanner and detector and a stage relatively movable with respect to said scanner and detector, and wherein said tool includes means to measure the stage position with respect to a home position, the improvement comprising:
   said stage having a first and second members, said first member being configured to support a workpiece;
   said first member being formed of first and second materials;
   said first material having a first relatively low coefficient of thermal expansion;
   said second material having a second relatively higher coefficient of thermal expansion;
   said first material having a plurality of indicia marks formed thereon, each at a known distance from a home location;
   said second material having a plurality of indicia marks formed thereon, each at a known distance from said home location.

8. The invention as defined in claim 7 wherein said second member is a material having essentially a zero coefficient of thermal expansion.

9. A workpiece support member for supporting a workpiece within a processing tool, the processing tool causing the workpiece support member to be precisely repositioned within the processing tool by aligning to a plurality of indicia marks on the workpiece support member, the workpiece support member comprising:
   a first material having a first coefficient of thermal expansion, said first material having a first plurality of the indicia marks formed thereon; and
   a second material having a second coefficient of thermal expansion substantially different from said first coefficient of thermal expansion, said second material having a second plurality of the indicia marks formed thereon.

10. The invention as defined in claim 9, wherein said second coefficient of thermal expansion is essentially zero.

* * * * *